United States Patent [19]

Gardner

[11] Patent Number: 4,887,138
[45] Date of Patent: Dec. 12, 1989

[54] P-I-N PHOTODETECTOR HAVING A BURRIED JUNCTION

[75] Inventor: Peter D. Gardner, Morrisville, Pa.

[73] Assignee: The United States of America as represented by the Secetary of the Air Force, Washington, D.C.

[21] Appl. No.: 175,064

[22] Filed: Mar. 23, 1988

[51] Int. Cl.$^4$ ............................................. H01L 29/12
[52] U.S. Cl. ..................................... 357/30; 357/58:16; 357/32; 357/20
[58] Field of Search ..................... 357/58, 30 P, 30 E, 357/30 H, 30 B, 16, 32, 20

[56] References Cited

U.S. PATENT DOCUMENTS

| | | | |
|---|---|---|---|
| Re. 28,032 | 6/1974 | Scott et al. | 357/30 E X |
| 4,068,252 | 1/1978 | Lebailly | 357/16 X |
| 4,231,049 | 10/1980 | Pearsall | 357/16 X |
| 4,282,541 | 8/1981 | Tsang | 357/30 |
| 4,390,889 | 6/1983 | Capasso et al. | 357/30 |
| 4,451,838 | 5/1984 | Yamazaki | 357/2 |
| 4,477,964 | 10/1984 | Chin et al. | 29/572 |
| 4,488,038 | 12/1984 | Harrison et al. | 250/211 J |
| 4,499,483 | 2/1985 | Yamazaki et al. | 357/58 X |
| 4,544,938 | 10/1985 | Scholl | 357/30 E OR |

FOREIGN PATENT DOCUMENTS 2029639 3/1980 United Kingdom ......... 357/30 E X

Primary Examiner—Rolf Hille
Assistant Examiner—William A. Mintel
Attorney, Agent, or Firm—Robert L. Nathans; Donald J. Singer

[57] ABSTRACT

A P-I-N photodetector is fabricated having a first upper light transmitting $n^-$InP layer overlaying a second light absorbing layer of $n^-$GaInAs in turn overlaying a substrate of $n+$InP or $N+$GaAs, together with $p+$ ion implant zones formed within the first layer which completely penetrate the first layer and partially penetrate the second layer to form a buried junction within the second layer, the junction being exposed to ambient air. The implants are preferably formed by ion implantation of Be, Cd, Zn or Mg.

4 Claims, 1 Drawing Sheet

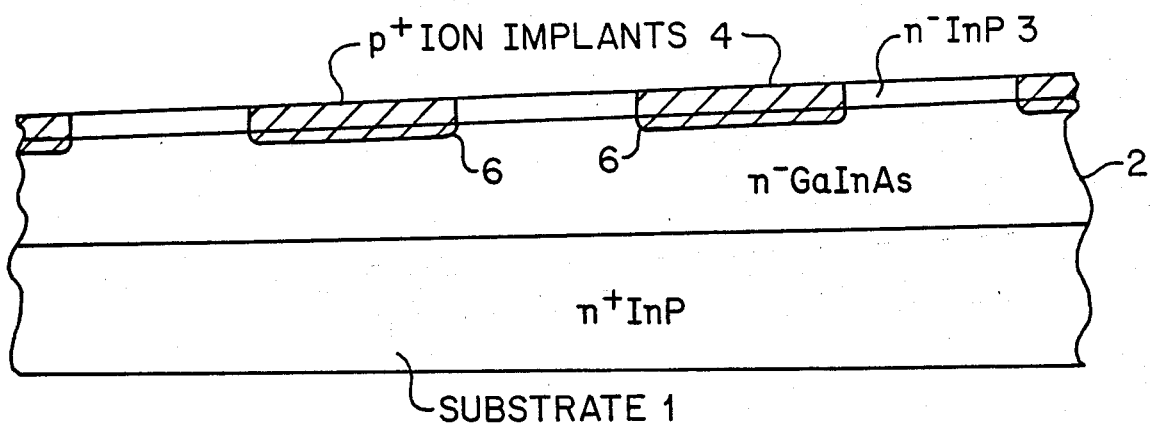

P-I-N PHOTODETECTOR HAVING A BURRIED JUNCTION

STATEMENT OF GOVERNMENT INTEREST

The invention described herein may be manufactured and used by or for the Government for governmental purposes without the payment of any royalty thereon.

BACKGROUND OF THE INVENTION

The present invention relates to the field of P-I-N photodetectors.

P-I-N photodetectors are fabricated by providing a top layer of heavily doped p+ semiconductor material, an intermediate layer of lightly-doped n− semiconductor material overlaying a substrate of heavily doped n+ material. The p+ and n− layers are thereafter etched to form mesas of these layers upon the substrate. The p+/n− interface is, however, exposed to air to produce leakage currents which increase over time, resulting in unsatisfactory operation or device failure, unless the interface is passivated. For a detailed description of such P-I-N photodetectors, see Pat. No. 4,477,964 and the papers listed therein.

SUMMARY OF THE INVENTION

It is an object of the present invention to provide an improved P-I-N photodetector for detecting light having a wavelength of about 1.3 micrometers.

It is a further object of the present invention to eliminate the necessity to passivate the exposed interface and simplify the fabrication process of producing a P-I-N photodetector.

A P-I-N photodetector is fabricated in accordance with the present invention, having a first upper light transmitting n−InP layer overlaying a second light absorbing layer of n−GaInAs in turn overlaying a substrate of n+InP or n+GaAs, together with p+ ion implant zones formed within the first layer which completely penetrate the first layer and partially penetrate the second layer to form a buried junction within the second layer, the junction being unexposed to ambient air. The implants are preferably formed by ion implantation of Be, Cd, Zn or Mg.

BRIEF DESCRIPTION OF THE DRAWINGS

Other objects, features and advantages of the present invention will become apparent upon study of the following detailed description taken in conjunction with the sole FIGURE illustrating a cross section of the novel photodetector of the invention.

DETAILED DESCRIPTION OF A PREFERRED EMBODIMENT

In the sole FIGURE, a S or Se doped substrate 1 is provided of n+InP or n+GaAs semiconductor material. A second layer of n−GaInAs semiconductor material is formed upon substrate 1 and a top layer of n−InP material is formed upon the intermediate layer 2. As is well-known to workers in the art, the symbol n− refers to light doping of the substrate having free n carriers whereas n+ indicates heavy doping of substrate 1. The ion concentration to obtain light and heavy doping indicated by ions per cubic centimeter are well-known in the art and need not be set forth herein. Intermediate layer 2 had a thickness of about 5 micrometers and top layer 3 had a thickness of about 0.3 micrometers in the devices constructed in accordance with the invention. A plurality of implant zones 4 are formed within top layer 3 and penetrate intermediate layer 2 as illustrated. The implant zones are created preferably by ion implantation of Be, Cd, Zn, or Mg. In the devices constructed in accordance with this invention Be was ion implanted at 180 kvE with doses of $1.2 \times 10^{14}$ ions/cm$^3$. These energies were chosen so that the Be implant would completely penetrate the 0.3 micrometer thick upper layer 3 to form a buried junction 6 within intermediate layer 2. The wafer was flash annealed (about 700° C. for 3 seconds) after the Be implantation.

Thus in accordance with this invention, a buried junction 6 is formed within intermediate layer 2 which is, in contrast with the prior art, not exposed to ambient air so that no passivating of the interface is required. Leakage currents are low throughout the lifetime of the device since the top layer 3 fortuitously has very low recombination velocities and is thus self-passivating. Thus the top layer 3 co-acts with buried junction 6 to form an easily fabricated P-I-N photodetector having low leakage currents throughout the lifetime of the device.

Implant zones 4 could be formed within layers 2 and 3 by means of diffusion rather than ion implantation. The leakage current was less than 50 nA up to 10 volts reverse bias and the breakdown characteristic was soft and occurred at about 15–20 volts in devices fabricated in accordance with the present invention. The scope of the invention is defined by the language of the following claims which is intended to cover equivalent steps and materials to those described.

What is claimed is:

1. In a P-I-N photodetector device having a first upper light transmitting n−InP layer having a low recombination velocity overlaying a second light absorbing layer of n−GaInAs in turn overlaying a substrate of a material selected from the group consisting of n+InP and n+GaAs, the improvement comprising:
   at least one p+ ion implant zone formed within said first upper light transmitting n−InP layer having a low recombination velocity which completely penetrates said first upper light transmitting n−InP layer having a low recombination velocity and partially penetrates said second light absorbing layer of n−GaInAs to form a buried junction within said second light absorbing layer of n−GaInAs, said buried junction being unexposed to ambient air.

2. The device of claim 1 wherein said ion implant zone contains ions selected from the group consisting of Be, Cd, Zn and Mg.

3. The device of claim 1 wherein said first upper light transmitting n−InP layer having a low recombination velocity has a thickness of about 0.3 micrometers and said second light absorbing layer of n−GaInAs has a thickness of about 5 micrometers.

4. The device of claim 2 wherein said first upper light transmitting n−InP layer having a low recombination velocity has a thickness of about 0.3 micrometers and said second light absorbing layer of n−GaInAs has a thickness of about 5 micrometers.

* * * * *